(12) United States Patent
Kim et al.

(10) Patent No.: US 11,145,833 B2
(45) Date of Patent: Oct. 12, 2021

(54) STRETCHABLE SUBSTRATE STRUCTURE AND THE MANUFACTURING METHOD THEREOF, STRETCHABLE DISPLAY AND THE MANUFACTURING METHOD THEREOF, AND OPERATING METHOD OF STRETCHABLE DISPLAY

(71) Applicant: Korea University Research and Business Foundation, Sejong-si (KR)

(72) Inventors: Sang Il Kim, Yongin-si (KR); Mun Pyo Hong, Seongnam-si (KR); Dong Hyeok Lee, Seoul (KR); Ho Won Yoon, Seoul (KR); Min Hyun Jung, Sejong-si (KR)

(73) Assignee: Korea University Research and Business Foundation, Sejong Campus, Sejong-si (KR)

( * ) Notice: Subject to any disclaimer, the term of this patent is extended or adjusted under 35 U.S.C. 154(b) by 16 days.

(21) Appl. No.: 16/715,267

(22) Filed: Dec. 16, 2019

(65) Prior Publication Data
US 2020/0119294 A1  Apr. 16, 2020

Related U.S. Application Data

(63) Continuation of application No. PCT/KR2018/006655, filed on Jun. 12, 2018.

(30) Foreign Application Priority Data

Jun. 15, 2017  (KR) .................. 10-2017-0075621

(51) Int. Cl.
| | | |
|---|---|---|
| H01L 51/00 | (2006.01) | |
| H01L 27/32 | (2006.01) | |
| H01L 51/56 | (2006.01) | |

(52) U.S. Cl.
CPC ...... *H01L 51/0097* (2013.01); *H01L 27/3262* (2013.01); *H01L 27/3276* (2013.01);
(Continued)

(58) Field of Classification Search
None
See application file for complete search history.

(56) References Cited

U.S. PATENT DOCUMENTS

| | | |
|---|---|---|
| 10,026,844 B2 | 6/2018 | Cho et al. |
| 2014/0138637 A1 | 5/2014 | Yang et al. |

(Continued)

FOREIGN PATENT DOCUMENTS

| | | |
|---|---|---|
| KR | 10-2012-0041044 A | 4/2012 |
| KR | 10-2014-0046620 A | 4/2014 |

(Continued)

OTHER PUBLICATIONS

Wang, Jiangxin, and Pooi See Lee. "Progress and Prospects in Stretchable Electroluminescent Devices." Nanophotonics, vol. 6, No. 2, 2017, pp. 435-451., doi: 10.1515/nanoph-2016-0002. (Year: 2017).*

(Continued)

*Primary Examiner* — J. E. Schoenholtz
(74) *Attorney, Agent, or Firm* — Sughrue Mion, PLLC

(57) ABSTRACT

A stretchable display according to one embodiment of the present invention comprises: a hybrid stretchable substrate divided into a low stretchable region and a high stretchable region having a modulus lower than that of the low stretchable region; a driving element layer including a driving element on the low stretchable region so as to control a light emitting layer, and wiring on the high stretchable region so as to be electrically connected to a part of the driving element to apply an electrical signal; and the light emitting layer provided on the driving element layer, and electrically connected to the driving element layer to emit light, wherein, between the driving element and the wiring, the wiring can overlap a stretchable mask pattern having a shape corresponding to either the low stretchable region or high stretchable region.

17 Claims, 14 Drawing Sheets

(52) U.S. Cl.
CPC ............ *H01L 51/003* (2013.01); *H01L 51/56* (2013.01); *H01L 2227/326* (2013.01); *H01L 2251/5338* (2013.01)

(56) References Cited

U.S. PATENT DOCUMENTS

2015/0048375 A1\* 2/2015 Oh .................... H01L 29/78603
 257/66
2017/0249886 A1\* 8/2017 Choi ...................... G09G 3/007

FOREIGN PATENT DOCUMENTS

| KR | 10-2015-0020922 A | 2/2015 |
|----|-------------------|---------|
| KR | 10-2015-0072432 A | 6/2015 |
| KR | 10-2015-0115019 A | 10/2015 |
| KR | 10-2015-0138913 A | 12/2015 |
| KR | 10-2016-0021071 A | 2/2016 |
| KR | 10-2017-0033753 A | 3/2017 |
| KR | 10-1720647 B1 | 3/2017 |

OTHER PUBLICATIONS

International Search Report for PCT/KR2018/006655 dated Aug. 27, 2018 (PCT/ISA/210).

\* cited by examiner

[Fig. 1]
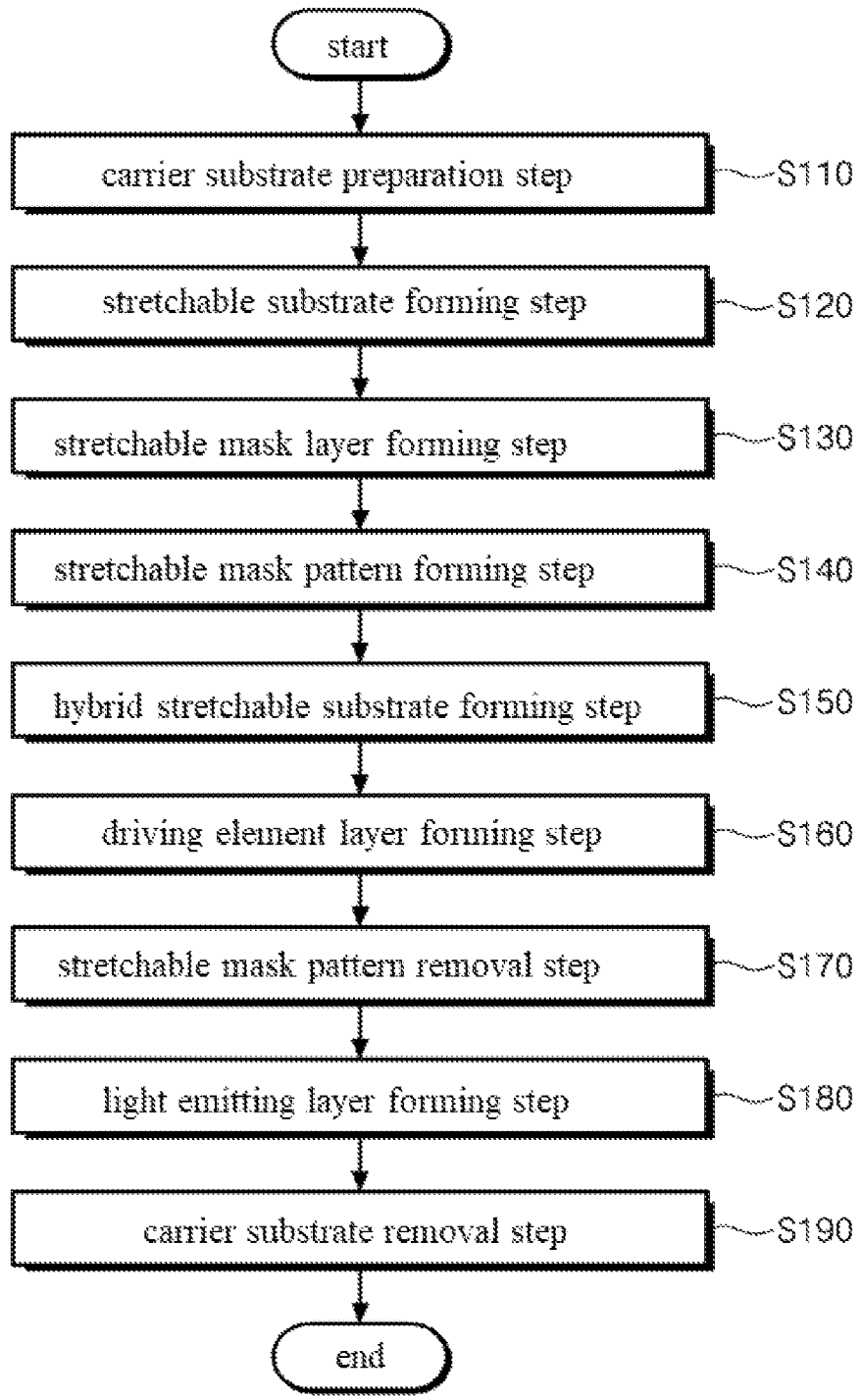

S110 & S120
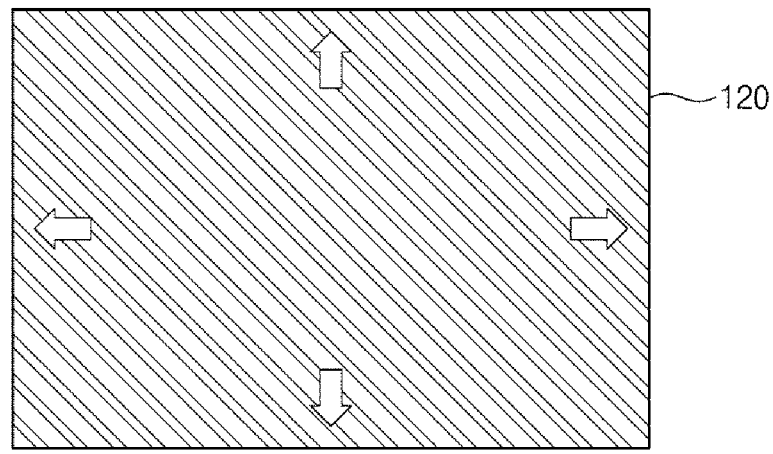
[Fig. 2a]
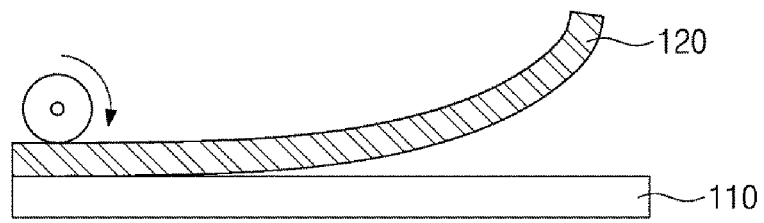
[Fig. 2b]

[Fig. 3]
S130
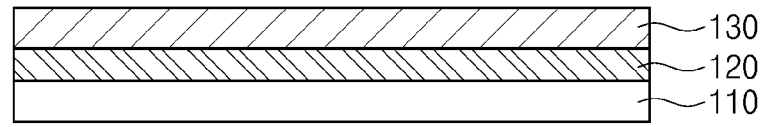

S140
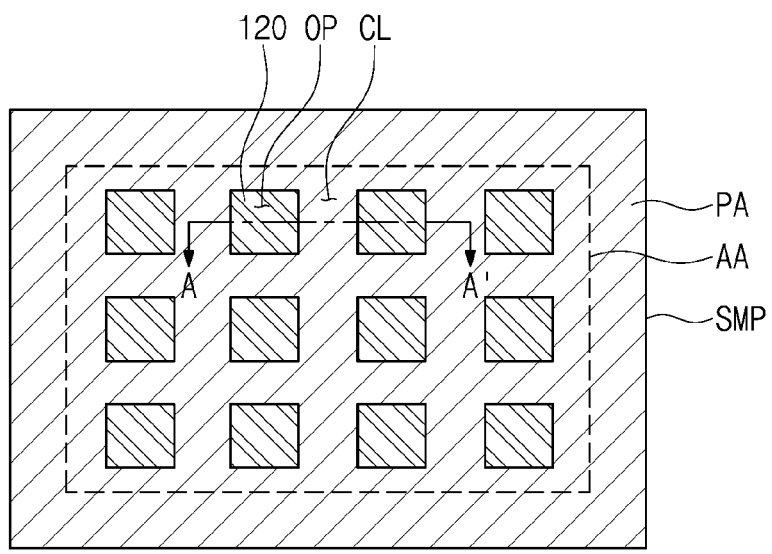
[Fig. 4a]
A-A'
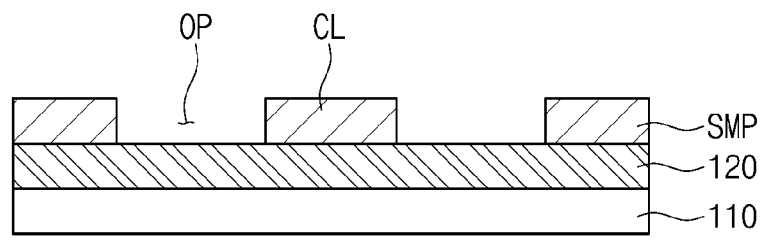
[Fig. 4b]

S150
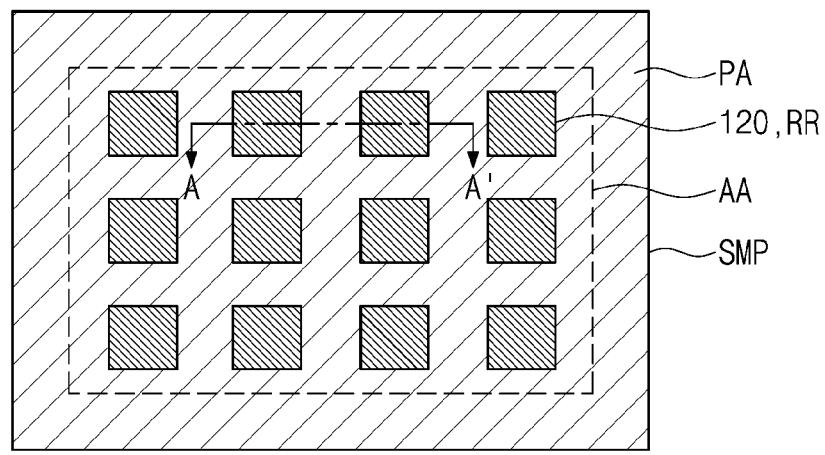
[Fig. 5a]
A-A'
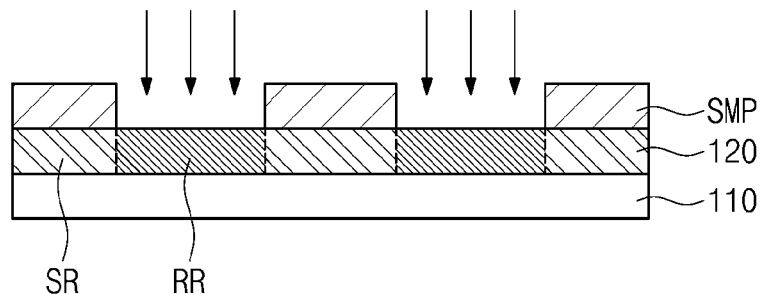
[Fig. 5b]

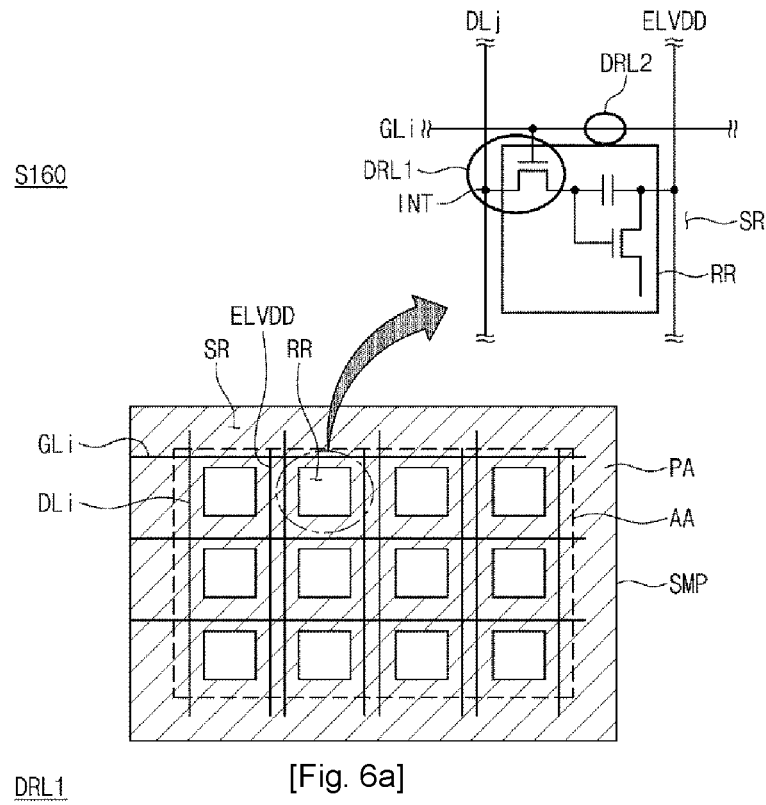
[Fig. 6a]
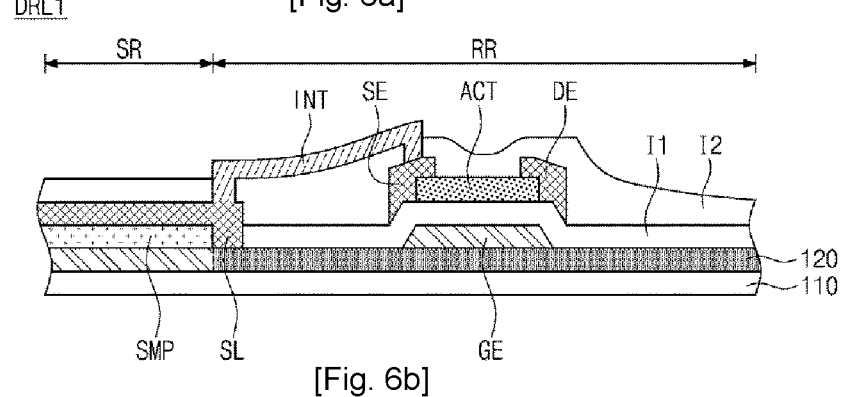
[Fig. 6b]
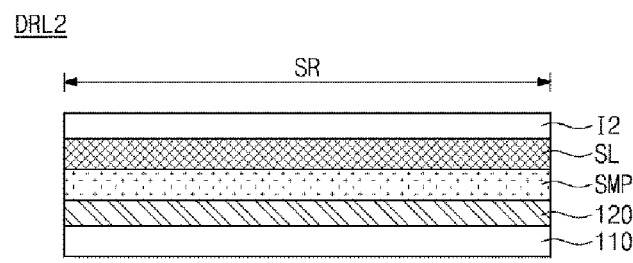
[Fig. 6c]

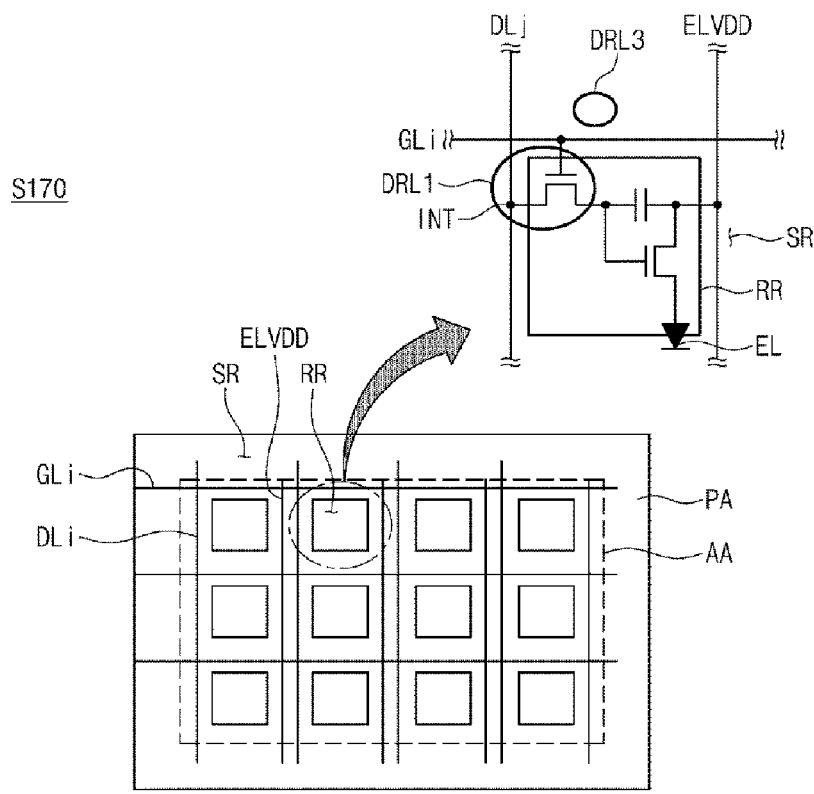
[Fig. 7a]
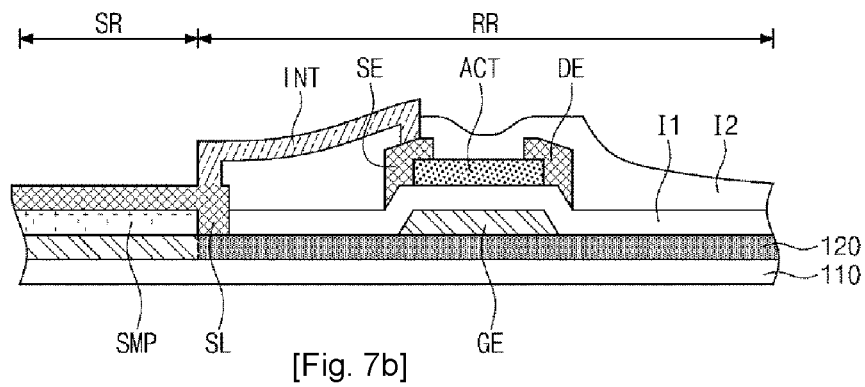
[Fig. 7b]
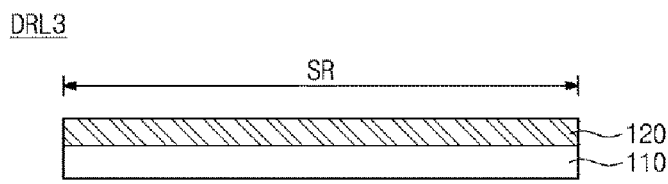
[Fig. 7c]

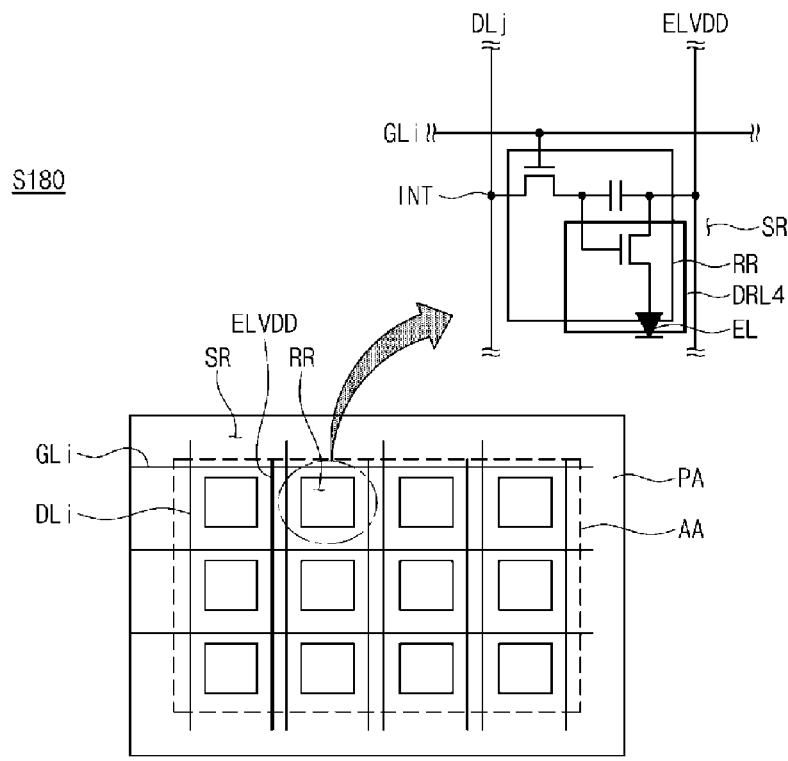
[Fig. 8a]
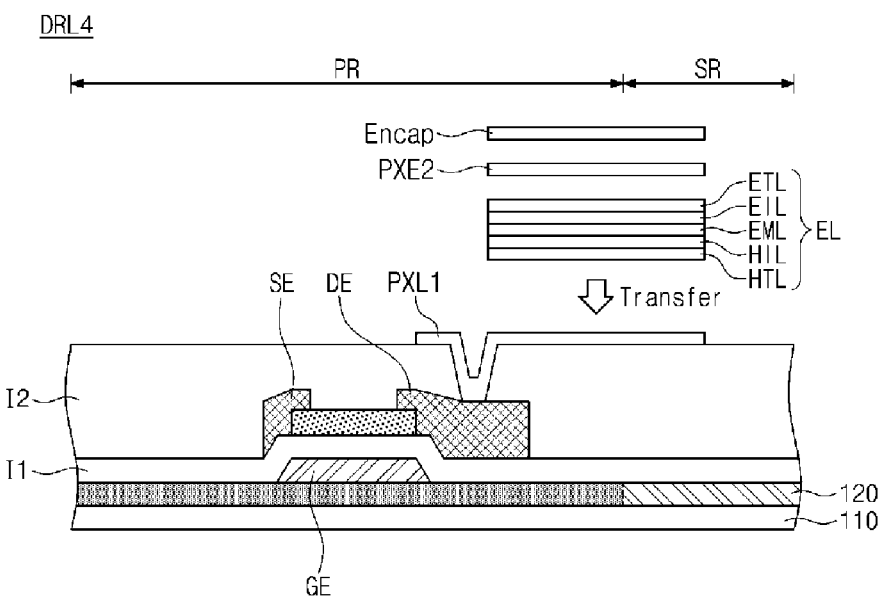
[Fig. 8b]

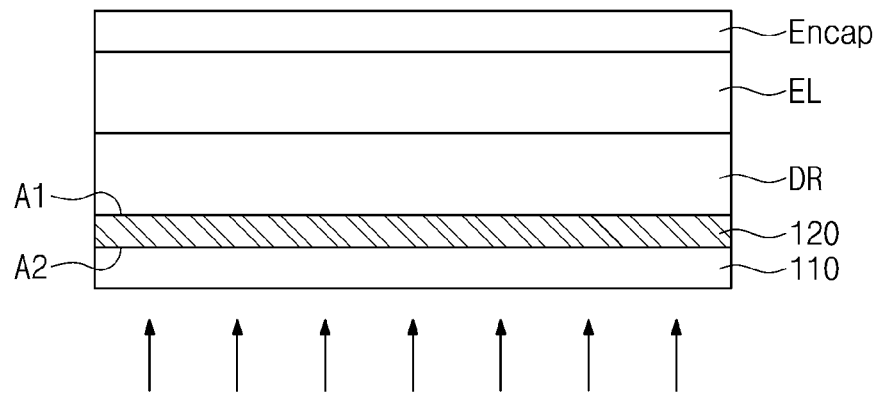
[Fig. 9a]
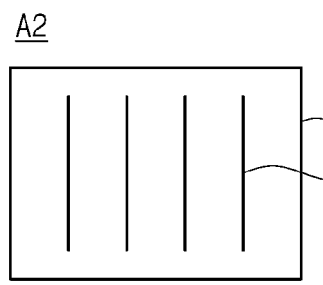
[Fig. 9(b1)]
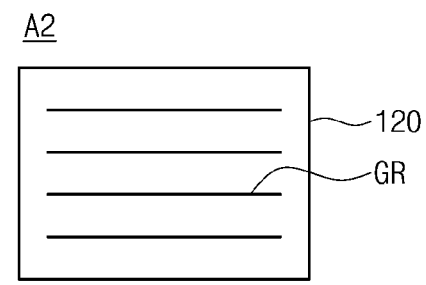
[Fig. 9(b2)]
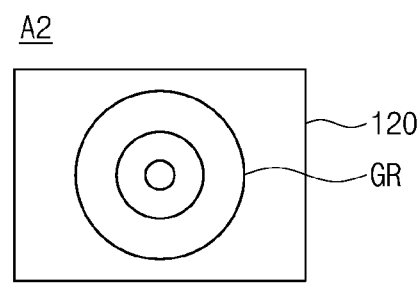
[Fig. 9(b3)]

[Fig. 10]
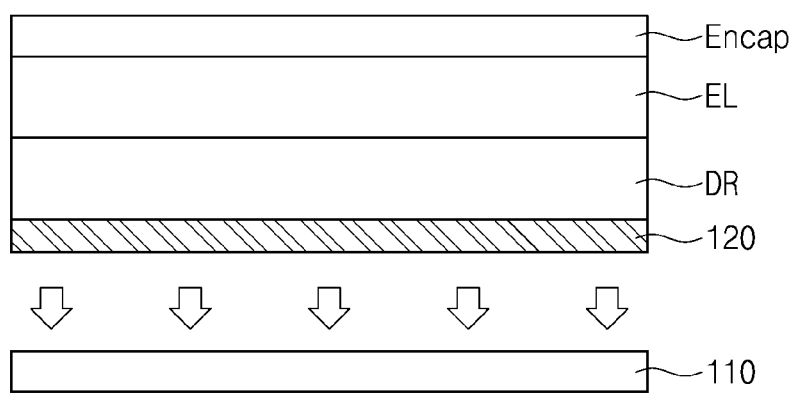

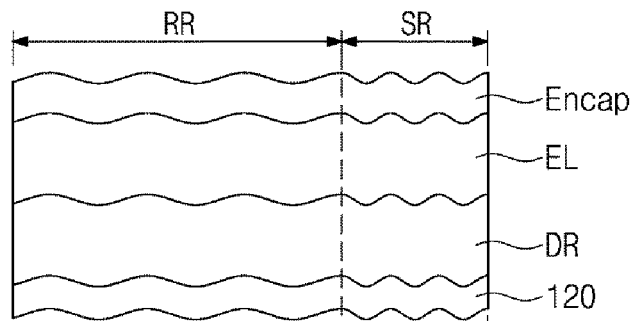
[Fig. 11a]
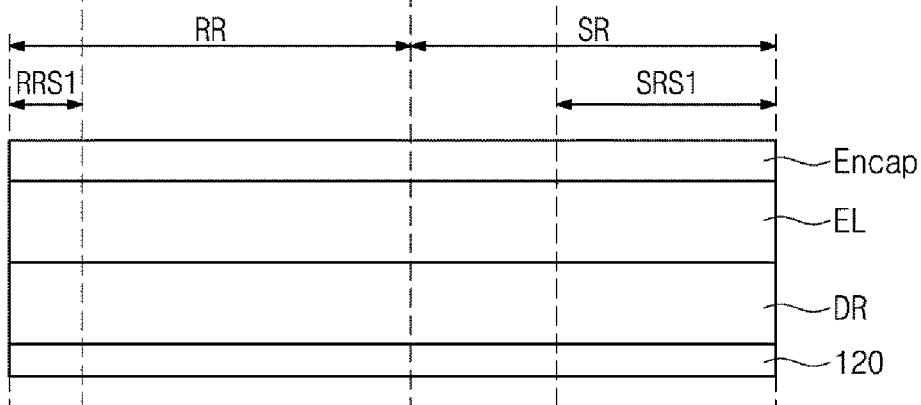
[Fig. 11b]
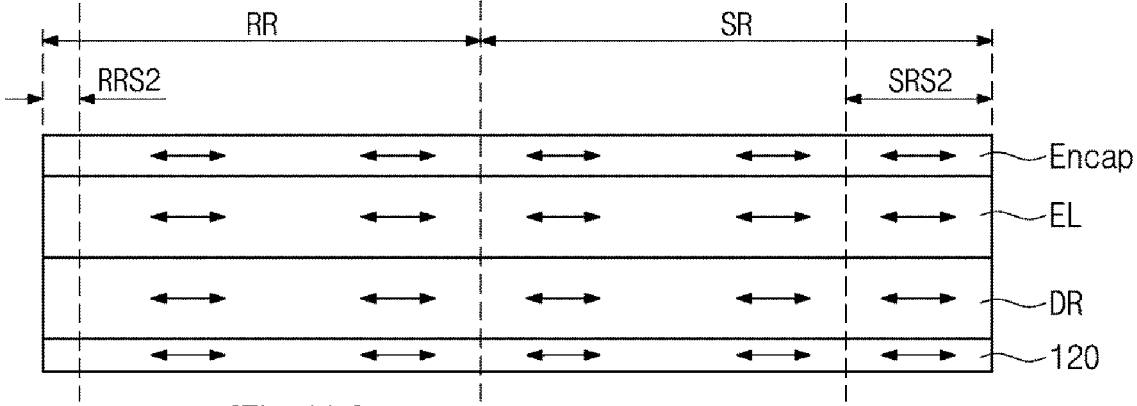
[Fig. 11c]

[Fig. 12]
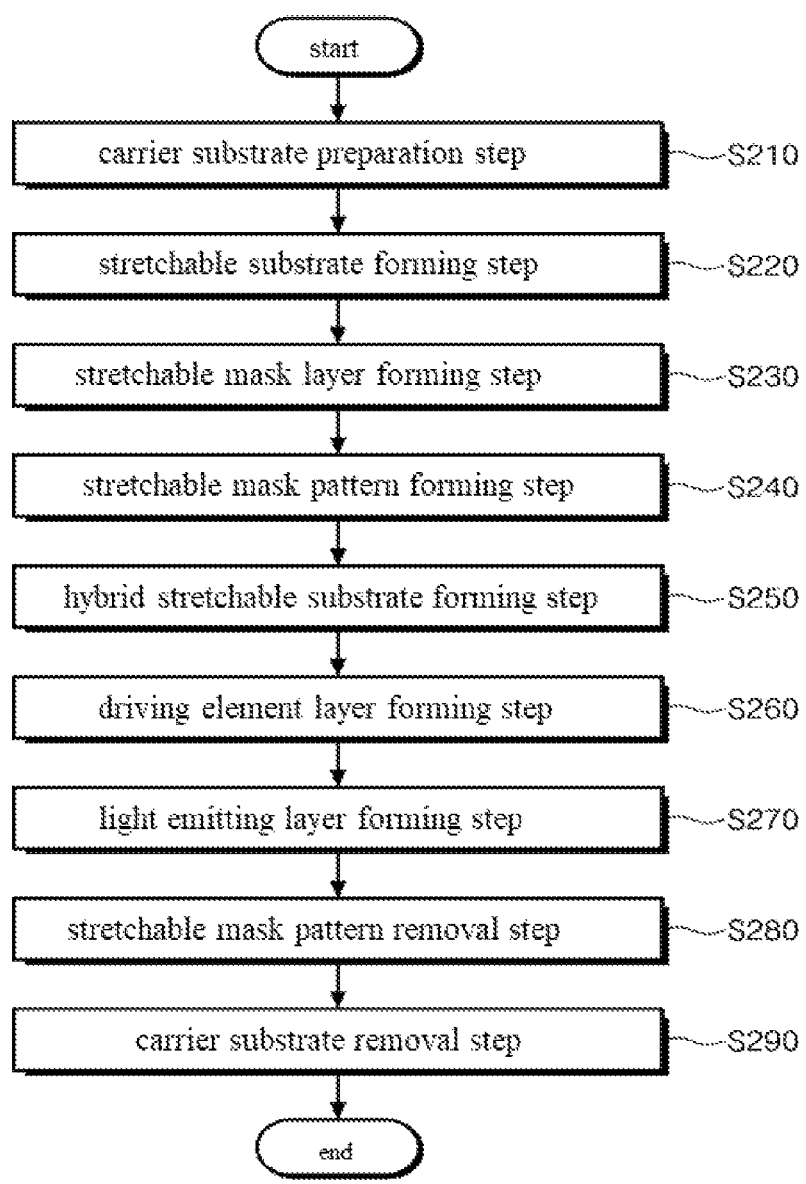

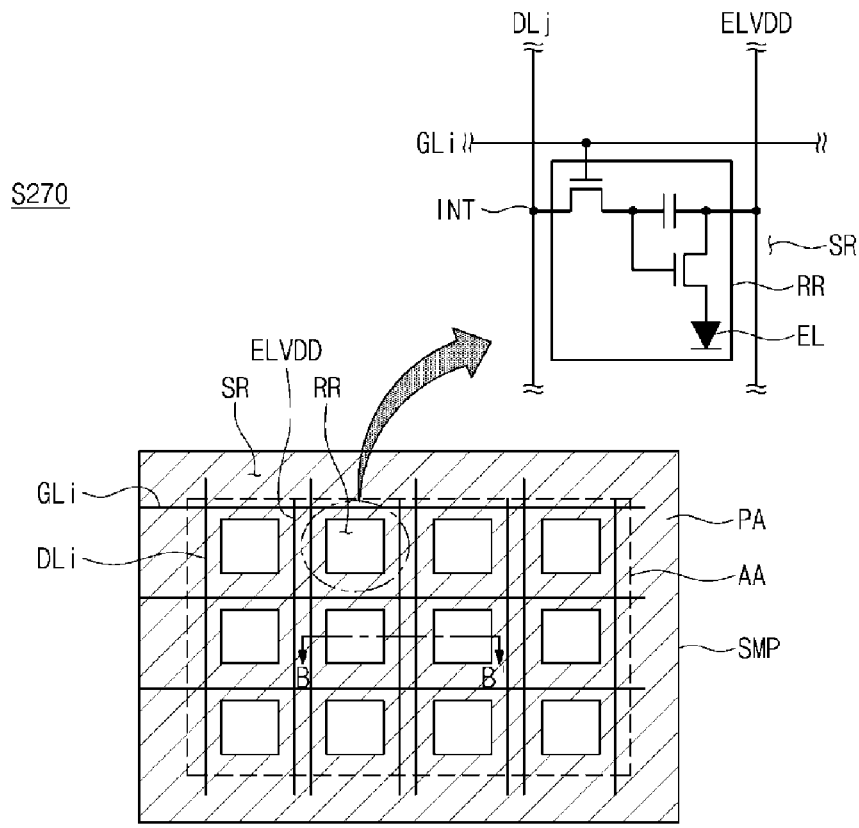
[Fig. 13a]
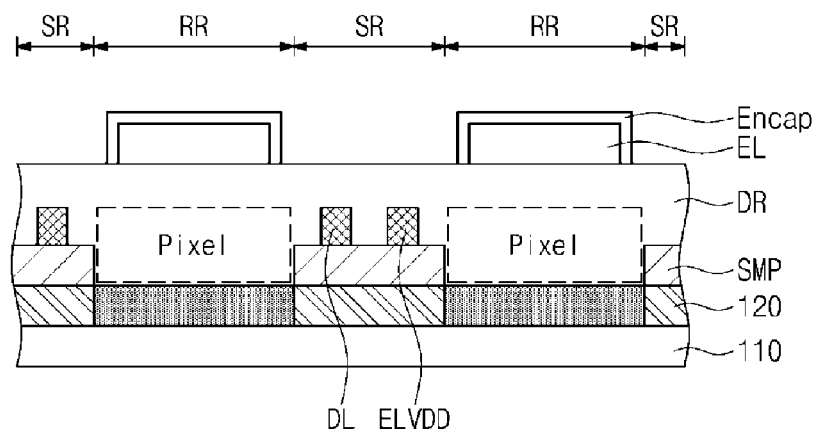
[Fig. 13b]

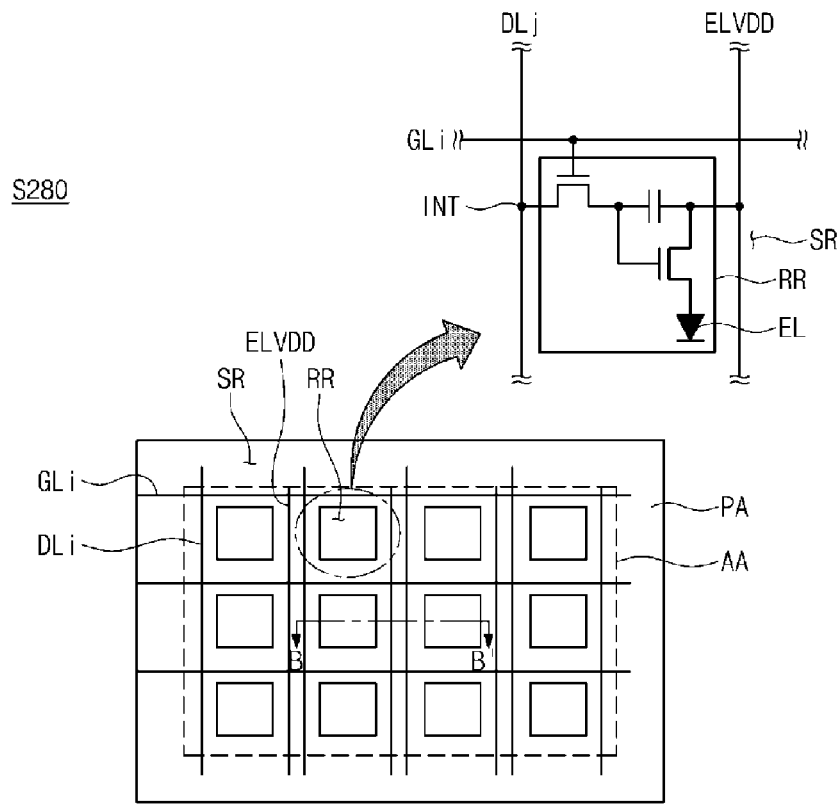
[Fig. 14a]
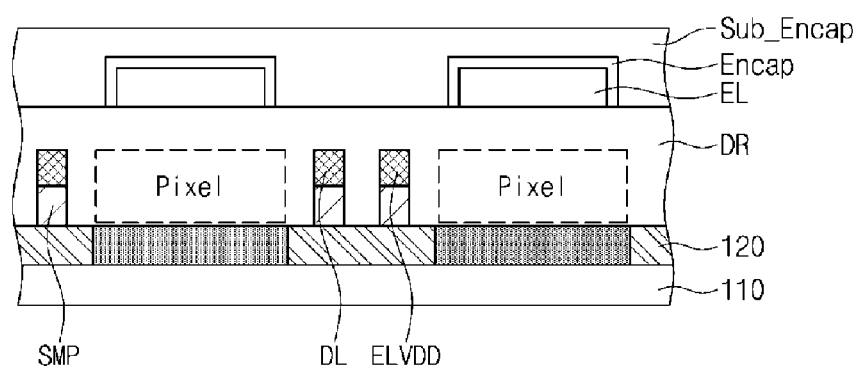
[Fig. 14b]

STRETCHABLE SUBSTRATE STRUCTURE AND THE MANUFACTURING METHOD THEREOF, STRETCHABLE DISPLAY AND THE MANUFACTURING METHOD THEREOF, AND OPERATING METHOD OF STRETCHABLE DISPLAY

TECHNICAL FIELD

The present invention relates to a stretchable substrate structure and a method for manufacturing the same, a stretchable display and a method for manufacturing the same, and a method for using the stretchable display. More specifically, the present invention relates to a stretchable substrate structure including a low stretchable region having a relatively low stretchability and a high stretchable region having a relatively high stretchability and a method for manufacturing the same, a stretchable display and a method for manufacturing the same, and a method for using the stretchable display.

BACKGROUND ART

Conventional displays mean devices that simply output electrical signals in the form of videos. Recently, however, the display is not only developed as a device for displaying information, but also has a flexible property.

The flexible displays sequentially evolve into a bendable stage where the display can be flexed and bent, a rollable stage where the display can be rolled like a roll, and a foldable stage where the display can be folded like a piece of paper. Further, latest displays evolve into a stretchable stage where the display can be scaled up and down while being stretched or shrunk in a first axis direction or a second axis direction.

In particular, the stretchable display has been spotlighted because the stretchable display meets the market characteristics that require stretchability, such as wearable devices.

However, various technical problems have to be solved in order to manufacture the stretchable displays. When the conventional stretchable display process is applied to the stretchable display process, there is a problem that it is difficult to retain the stretchability because the thickness of a polymer substrate of the conventional stretchable display is thick. That is, since the substrate needs to be thinner in order to have stretchability, there is a limitation when the conventional stretchable display manufacturing process is applied to the stretchable display manufacturing process.

Meanwhile, a hybrid type stretchable display having a low stretchable region where a low stretchable element is disposed and a high stretchable region where a high stretchable element is disposed has been developed. Since a single pixel typically has a size no more than a few tens of microns, the high and low stretchable regions have to be patterned in units of at least tens of microns. However, the stretchable substrate structure or the stretchable displays, which can be patterned in units of tens of microns or less, have not been yet developed.

Accordingly, the inventors of the present invention have invented a technique capable of implementing pixel-by-pixel patterning in a simple manner while preventing damage to the stretchable substrate.

DISCLOSURE

Technical Problem

One technical object of the present invention is to provide a stretchable substrate structure having a high stretchable region and a low stretchable region which can be finely patterned, and a method for manufacturing the same, and a stretchable display and a method for manufacturing the same.

Another technical object of the present invention is to provide a stretchable display and a method for manufacturing the same capable of minimizing damage to a stretchable substrate.

Still another technical object of the present invention is to provide a stretchable substrate structure having high stretchability and a method for manufacturing the same, a stretchable display and a method for manufacturing the same, and a method for using the stretchable display.

Still another technical object of the present invention is to provide a stretchable substrate structure having excellent economic efficiency and a method for manufacturing the same, and a stretchable display and a method for manufacturing the same.

Still another technical object of the present invention is to provide a stretchable substrate structure having a simple manufacturing process and a method for manufacturing the same, and a stretchable display and a method for manufacturing the same.

Still another technical object of the present invention is to provide a stretchable display having high stretchability while minimizing a degradation of an image quality and a method for manufacturing the same, and a method for using the stretchable display.

The technical objects of the present invention are not limited to the above.

Technical Solution

According to one embodiment of the present invention, there is provided a stretchable display including: a hybrid stretchable substrate divided into a low stretchable region and a high stretchable region having a modulus lower than a modulus of the low stretchable region; a driving element layer including a driving element formed on the low stretchable region to control a light emitting layer, and a wiring formed on the high stretchable region and electrically connected to a part of the driving element to apply an electrical signal; and the light emitting layer provided on the driving element layer, and electrically connected to the driving element layer to emit light, wherein, between the driving element and the wiring, the wiring overlaps a stretchable mask pattern having a shape corresponding to one of the low stretchable region and the high stretchable region.

According to one embodiment, the low stretchable region may have an island shape surrounded by the high stretchable region.

According to one embodiment, the modulus may become higher in an order of the high stretchable region, the stretchable mask pattern formed on the high stretchable region, and the wiring overlapping the stretchable mask pattern.

According to one embodiment, the stretchable mask pattern may include an amorphous metal alloy or a barrier.

According to one embodiment, the amorphous metal alloy may be an amorphous-state alloy consisting of at least two metals that interfere with each other when forming regular structures.

According to one embodiment, the stretchable mask pattern may protect the high stretchable region under the stretchable mask pattern.

According to one embodiment, a part of the driving element may be electrically connected to the wiring, and a step difference may be formed between the part of the driving element and the wiring due to the stretchable mask pattern under the wiring.

According to one embodiment, a protective layer covering the driving element and the wiring may be further provided and a part of the driving element and a part of the wiring may be electrically interconnected to each other by an interconnector passing through the protective layer.

According to one embodiment, a modulus difference between the low stretchable region and the high stretchable region may be 10 times or more.

According to one embodiment, the wiring may have a resistance within 1.5 times when stretched at most 10%.

According to one embodiment, the light emitting layer may be formed over at least a part of the low stretchable region and at least a part of the high stretchable region.

According to one embodiment, the light emitting layer may be selective formed on the low stretchable region between the low stretchable region and the high stretchable region.

According to one embodiment, the light emitting layer may include a plurality of light emitting portions spaced apart from each other in a unit of a pixel, and an encapsulation layer for protecting the light emitting portions spaced apart from each other.

According to one embodiment, a groove may be formed on a surface of the stretchable substrate opposite to a surface where the driving element layer and the light emitting layer are formed, in order to provide a stretching path of the stretchable substrate.

According to one embodiment, the driving element layer may be formed on a display area and may include a driving circuit element formed on a peripheral area around the display area to apply an electric signal to the driving element layer.

According to one embodiment, when the driving circuit element is prepared in the form of an IC chip, the driving circuit element may be formed on the low stretchable region.

According to one embodiment, when the driving circuit element is prepared in the form of a flexible film, the driving circuit element may be formed on the high stretchable region.

According to one embodiment, the hybrid stretchable substrate may have wrinkles in a thickness direction of the stretchable substrate, and the low stretchable region may have less wrinkles than the high stretchable region.

According to one embodiment, the hybrid stretchable substrate may have stretchability in at least one of a first axis direction and a second axis direction different from the first axis direction.

According to one embodiment, the hybrid stretchable substrate may be maintained in a first stretched state contracted in a wrinkled state, a second stretched state in which the wrinkled state is spread and stretched more than the first stretched state, and a third stretched state in which a material of the stretchable substrate is spread and stretched more than the second stretched state.

A method for manufacturing a stretchable display according to one embodiment of the present invention includes: preparing a carrier substrate; forming a stretchable substrate on the carrier substrate; forming a stretchable mask layer on the stretchable substrate; forming a stretchable mask pattern having an opening region and a closing region by patterning the stretchable mask layer; forming a low stretchable region and a high stretchable region having a modulus lower than a modulus of the low stretchable region on the stretchable substrate through the opening region and the closing region of the stretchable mask pattern; forming driving element for controlling a light emitting layer of a pixel on the low stretchable region and forming a wiring for applying an electrical signal to the driving element on the high elastic region, in which the wiring is formed on the stretchable mask pattern forming the closing region; and forming the light emitting layer electrically connected to the driving element to emit light.

According to one embodiment, the forming of the stretchable substrate may include bonding the stretchable substrate onto the carrier substrate or coating the carrier substrate with the stretchable substrate.

According to one embodiment, a temperature-sensitive double-sided adhesive may be used in the bonding stage.

According to one embodiment, the forming of the stretchable substrate may include attaching the stretchable substrate to the carrier substrate in a state in which the stretchable substrate is stretched in a first axis direction or a second axis direction.

According to one embodiment, when the stretchable substrate is attached to the carrier substrate in a stretched state, a groove may be formed on one surface of the stretchable substrate by emitting light toward a surface of the carrier substrate opposite to a surface where the stretchable substrate is formed, in order to provide a stretching path of the stretchable substrate.

According to one embodiment, in the forming of the groove, a light source forming the groove may be absorbed in the stretchable substrate and may pass through the carrier substrate.

According to one embodiment, the stretchable mask layer and the stretchable mask pattern may include an amorphous metal alloy or a barrier.

According to one embodiment, the amorphous metal alloy may be an amorphous-state alloy consisting of at least two metals that interfere with each other when forming regular structures.

According to one embodiment, the forming of the stretchable mask pattern may include forming the stretchable mask pattern by using a photolithography process.

According to one embodiment, the forming of the hybrid stretchable substrate may include forming the low stretchable region by curing the stretchable substrate through the opening region formed by a photolithography process.

According to one embodiment, the low stretchable region may have an island shape.

According to one embodiment, the method may further include removing the stretchable mask pattern after the forming of the driving element and before the forming of the light emitting layer.

According to one embodiment, the stretchable mask pattern may protect the high stretchable region from the process of forming the driving element layer.

According to one embodiment, after removing the stretchable mask pattern, the stretchable mask pattern in a region overlapping the wiring may remain, and the stretchable mask pattern in a region not overlapping the wiring may be removed.

According to one embodiment, the etching selectivity between the wiring and the stretchable mask pattern may be at least 10 or more.

According to one embodiment, at least one of the light emitting layers may be transferred on the driving element layer.

According to one embodiment, at least one of the light emitting layers may be vapor-deposited on the driving element layer.

According to one embodiment, the light emitting may be formed on at least a portion of the low stretchable region and at least a portion of the high stretchable region.

According to one embodiment, the method may further include removing the stretchable mask pattern after the forming of the driving element layer and the forming of the light emitting layer.

According to one embodiment, the stretchable mask pattern may protect the high stretchable region from the process of forming the driving element layer and forming the light emitting layer.

According to one embodiment, after removing the stretchable mask pattern, the stretchable mask pattern in a region overlapping the wiring may remain, and the stretchable mask pattern in a region not overlapping the wiring may be removed.

According to one embodiment, the forming of the driving element layer may include selectively forming the driving element on the low stretchable region between the low stretchable region and the high stretchable region, and the forming of the light emitting layer may include selectively forming the light emitting layer on the low stretchable region between the low stretchable region and the high stretchable region.

According to one embodiment, the method may further include forming an encapsulation layer for protecting the light emitting layer after the forming of the light emitting layer, and the removing of the stretchable mask pattern may be performed after forming the encapsulation layer.

According to one embodiment, the forming of the encapsulation layer may include covering the light emitting layer formed on the low stretchable region with the encapsulation layer on a pixel basis to expose the stretchable mask pattern formed on the high stretchable region.

According to one embodiment, the method may further include forming an auxiliary encapsulation layer for covering the encapsulation layer over the low stretchable region and the high stretchable region.

According to one embodiment, the modulus may become higher in the order of the high stretchable region, the stretchable mask pattern formed on the high stretchable region, and the wiring formed on the stretchable mask pattern forming the closing region.

According to one embodiment, the forming of the driving element layer may further include forming a protective layer covering the driving element and the wiring.

According to one embodiment, the forming of the driving element layer may include forming a through hole exposing a part of the driving element and a part of the wiring after forming the protective layer and forming an interconnector via a through hole to electrically connect a portion of the driving element to a portion of the wiring, thereby eliminating a step difference caused by the stretchable mask pattern under the wiring.

According to one embodiment, the method may further include removing the carrier substrate from the hybrid stretchable substrate after the forming of the light emitting layer.

According to one embodiment, the carrier substrate may be removed from the hybrid stretchable substrate by being subjected to light irradiation or detachment temperature.

A stretchable substrate structure according to one embodiment of the present invention may include a hybrid stretchable substrate divided into a low stretchable region and a high stretchable region having a modulus lower than a modulus of the low stretchable region; and a stretchable mask pattern having a shape corresponding to one of the low stretchable region and the high stretchable region.

A method of manufacturing a stretchable substrate structure according to one embodiment of the present invention includes: forming a stretchable mask layer on a stretchable substrate; forming a stretchable mask pattern having an opening region and a closing region by patterning the stretchable mask layer; and forming a hybrid stretchable substrate by forming a low stretchable region and a high stretchable region having a modulus lower than a modulus of the low stretchable region on the stretchable substrate through the opening region and the closing region of the stretchable mask pattern.

A method for using a stretchable display according to one embodiment of the present invention may include first use state in which the stretchable substrate is contracted in a wrinkled state; a second use state in which the wrinkled state is spread and stretched more than the first use state; and a third use state in which a material of the stretchable substrate, which is spread from the wrinkled state, is stretched more than the second use state. According to one embodiment, the stretchable display may include: a hybrid stretchable substrate divided into a low stretchable region and a high stretchable region having a modulus lower than a modulus of the low stretchable region; and a driving element layer including a driving element formed on the low stretchable region to control a light emitting layer, and a wiring formed on the high stretchable region and electrically connected to a part of the driving element to apply an electrical signal.

According to one embodiment, the wiring formed on the high stretchable region may be stretched more than the driving element formed on the low stretchable region in the second use state.

Advantageous Effects

According to one embodiment of the present invention, fine patterning can be implemented because the high stretchable region and the low stretchable region are partitioned on the stretchable substrate through the stretchable mask pattern.

According to one embodiment of the present invention, the stretchable mask pattern can protect the high stretchable region during the process so that high reliability can be ensured.

According to one embodiment of the present invention, it is possible to provide both the stretching according to the geometric characteristics and the stretching according to the material properties so that high stretchability can be provided.

According to one embodiment of the present invention, a wiring is provided in the high stretchable region and a driving element having stretchability lower than that of the wiring is provided in the low stretchable region, thereby minimizing deterioration of image quality while providing high stretchability.

According to one embodiment of the present invention, the conventional display process can be used, so that economic efficiency and the processability can be improved.

The effects of the present invention are not limited to those described above.

DESCRIPTION OF DRAWINGS

FIG. 1 is a flowchart illustrating a method for manufacturing a stretchable substrate structure and a stretchable display according to a first embodiment of the present invention.

FIGS. 2a and 2b are views for explaining steps S110 and S120 of FIG. 1 in detail.

FIG. 3 is a view for explaining step S130 of FIG. 1 in detail.

FIGS. 4a and 4b are views for explaining step S140 of FIG. 1 in detail.

FIGS. 5a and 5b are views for explaining step S150 of FIG. 1 in detail.

FIGS. 6a, 6b and 6c are views for explaining step S160 of FIG. 1 in detail.

FIGS. 7a, 7b and 7c are views for explaining step S170 of FIG. 1 in detail.

FIGS. 8a and 8b are views for explaining step S180 of FIG. 1 in detail.

FIGS. 9a, 9b1, 9b2 and 9b3 and 10 are views for explaining step S190 of FIG. 1 in detail.

FIGS. 11a, 11b and 11c are views for explaining a method for using a stretchable display according to a first embodiment of the present invention.

FIG. 12 is a flowchart illustrating a method for manufacturing a stretchable substrate structure and a stretchable display according to a second embodiment of the present invention.

FIGS. 13a and 13b are views for explaining step S270 of FIG. 12 in detail.

FIGS. 14a and 14b are views for explaining step S280 of FIG. 12 in detail.

BEST MODE

[Mode for Invention]

Hereinafter, preferred embodiments of the present invention will be described in detail with reference to the accompanying drawings. However, the technical spirit of the present invention is not limited to the embodiments, but may be realized in different forms. The embodiments introduced herein are provided to sufficiently deliver the spirit of the present invention to those skilled in the art so that the disclosed contents may become thorough and complete.

When it is mentioned in the specification that one element is on another element, it means that the first element may be directly formed on the second element or a third element may be interposed between the first element and the second element.

Further, in the drawings, the thicknesses of the membrane and areas are exaggerated for efficient description of the technical contents.

Further, in the various embodiments of the present invention, the terms such as first, second, and third are used to describe various elements, but the elements are not limited to the terms. The terms are used only to distinguish one element from another element. Accordingly, an element mentioned as a first element in one embodiment may be mentioned as a second element in another embodiment. The embodiments illustrated here include their complementary embodiments. Further, the term "and/or" in the specification is used to include at least one of the elements enumerated in the specification.

In the specification, the terms of a singular form may include plural forms unless otherwise specified. Further, the terms "including" and "having" are used to designate that the features, the numbers, the steps, the elements, or combination thereof described in the specification are present, and may be understood that one or more other features, numbers, step, elements, or combinations thereof may be added. In addition, the term "connection" used herein may include the meaning of indirectly connecting a plurality of components, and directly connecting a plurality of components.

Further, in the following description of the present invention, a detailed description of known functions and configurations incorporated herein will be omitted when it may make the subject matter of the present invention unnecessarily unclear.

FIG. 1 is a flowchart illustrating a method for manufacturing a stretchable substrate structure and a stretchable display according to a first embodiment of the present invention, FIGS. 2a and 2b are views for explaining steps S110 and S120 of FIG. 1 in detail, FIG. 3 is a view for explaining step S130 of FIG. 1 in detail, FIGS. 4a and 4b are views for explaining step S140 of FIG. 1 in detail, FIGS. 5a and 5b are views for explaining step S150 of FIG. 1 in detail, FIGS. 6a, 6b and 6c are views for explaining step S160 of FIG. 1 in detail, FIGS. 7a, 7b and 7c are views for explaining step S170 of FIG. 1 in detail, FIGS. 8a and 8b are views for explaining step S180 of FIG. 1 in detail, and FIGS. 9a, 9b1, 9b2 and 9b3 and 10 are views for explaining step S190 of FIG. 1 in detail.

Referring to FIG. 1, a method for manufacturing a stretchable substrate structure and a stretchable display according to a first embodiment of the present invention may include at least one of a carrier substrate preparation step (S110), a stretchable substrate forming step (S120), a stretchable mask layer forming step (S130), a stretchable mask pattern forming step (S140), a hybrid stretchable substrate forming step (S150), a driving element layer forming step (S160), a stretchable mask pattern removal step (S170), a light emitting layer forming step (S180), and a carrier substrate removal step (S190). For example, the stretchable substrate structure according to the first embodiment of the present invention may be manufactured by steps S110 to S150, and the stretchable display according to the first embodiment of the present invention may be manufactured by steps S110 to S190. Hereinafter, each step will be described.

Step S110

According to step S110, a carrier substrate 110 may be provided. The carrier substrate 110 may perform a function of supporting the stretchable substrate 120 so that various elements may be formed on the stretchable substrate 120 formed on an upper surface of the carrier substrate 110. For this purpose, the carrier substrate 110 may be formed of a material capable of providing a predetermined support force with respect to the stretchable substrate 120, for example, at least one material of glass, plastic, a metal plate, and a silicon wafer. Since the material for the carrier substrate 110 is only one example, it is not limited to the listed materials.

In addition, the carrier substrate 110 may be removed from the stretchable substrate 120 after required elements are formed on the stretchable substrate 120.

Step S120

According to step S120, the stretchable substrate 120 may be formed. The stretchable substrate 120 may provide stretchability to the stretchable display and may function as a substrate on which various kinds of elements are formed.

For this purpose, the stretchable substrate 120 may include a stretchable material, for example, an elastomer. In addition, the stretchable substrate 120 may further include a material that reacts to at least one of UV, plasma, ion beam, neutron beam, and chemical solution for patterning of a high stretchable region SR and a low stretchable region RR, which will be described later.

The stretchable substrate 120 may be formed on the carrier substrate 110 in various states. For example, as shown in FIG. 2(a), the stretchable substrate 120 may be formed on the carrier substrate 110 while being stretched in at least a first axis direction. For example, the stretchable substrate 120 may be formed on the carrier substrate 110 while being stretched in a horizontal axis direction and a vertical axis direction. Alternatively, the stretchable substrate 120 may be formed on the carrier substrate 110 without being stretched. Hereinafter, for the purpose of convenience of description, it is assumed that the stretchable substrate 120 is formed on the carrier substrate 110 in a stretched state.

The stretchable substrate 120 may be formed on the carrier substrate 110 by various methods. The stretchable substrate 120 may be formed on the carrier substrate 110 in such a manner that the adhesive force with the carrier substrate 110 may be maintained even in subsequent processes, and the carrier substrate 110 may be easily removed from the stretchable substrate 120 after the process is completed. For example, the stretchable substrate 120 may be attached onto the carrier substrate 110 through a double-sided adhesive. In this case, the double-sided adhesive may be an adhesive having an adhesive force that varies depending on the temperature. For example, the double-sided adhesive may have the property of losing adhesion at −30° C. or less. When the stretchable substrate 120 is bonded onto the carrier substrate 110 with an adhesive, as shown in FIG. 2(b), the stretchable substrate 120 may be bonded by using a roll in the stretched state. As another example, the stretchable substrate 120 in a solution state may be formed on the carrier substrate 110 through a coating process. In this case, the stretchable substrate 120 may be formed on the carrier substrate 110 while being stretched by heat treatment.

Step S130

In step S130, as illustrated in FIG. 3, the stretchable mask layer 130 may be formed on the stretchable substrate 120. The stretchable mask layer 130 may be formed on the stretchable substrate 120 while directly making contact with the stretchable substrate 120.

The stretchable mask layer 130 may function as a mask for patterning the stretchable substrate 120 into the high/low stretchable regions and may have functions of protecting the stretchable substrate 120 in subsequent processes and providing the stretchability.

For this purpose, the stretchable mask layer 130 may be formed of at least one material of an amorphous metal alloy and an organic barrier. The amorphous metal alloy may include an alloy consisting of two or more metals that interfere with each other when forming the regular structure and may not be limited to the examples of materials mentioned above. The amorphous metal alloy, for example, may include at least one material of FeZr, CoNi, La—Al_Cu, Al—Sc, ZrTiCuNiBe, AuSi, CuZr, CuPd, CuCo, CuPdCoP, PdAgSi, PdAgSiP, PdAgSiGe, PtCuAgPBSi, CuZrTiAl and CuZrTiAl, CuZrTiAl and CuZrTiAl.

In addition, the organic barrier may include at least one material of a self-assembled mono layer including alkylsiloxanes or a self-assembled nano particle layer including polystyrenes. The barrier may be an inorganic barrier, not an organic barrier, and may be a composite barrier including organic and inorganic barriers.

Hereinafter, for the sake of convenience of description, it will be assumed that the stretchable mask layer 130 is formed of an amorphous metal alloy.

Step S140

In step S140, a stretchable mask pattern may be formed. The stretchable mask pattern SMP having an opening region OP and a closing region CL may be formed by patterning the stretchable mask layer 130 according to step S130.

The stretchable mask pattern SMP having the opening region OP and the closing region CL may be formed through various ways by using the stretchable mask layer 130. For example, the opening region OP and the closing region CL may be formed through a photolithography process.

As shown in FIG. 4(a), the stretchable substrate 120 may be divided into a display area AA in which the light emitting layer EL is formed, and a peripheral area PA in which electric signal application wirings and driving circuit elements are formed.

The shape and position of the opening region OP and the closing region CL may be determined depending on where the high stretchable region SR and the low stretchable region RR are formed in the stretchable substrate 120. The low stretchable region RR may refer to a region having a modulus greater than a modulus of the high stretchable region SR. Accordingly, various types of elements having low stretchability, for example, transistors and capacitances may be formed in the low stretchable region RR defined by the opening region OP to provide stability even in a stretching environment, and the wirings having high stretchability may be formed in the high stretchable region SR defined by the closing region CL, thereby providing the stretchability.

For example, the opening region OP may be formed corresponding to at least a portion of the unit pixel of the display area AA. For example, the opening region OP may coincide with the unit pixel. A region other than the opening region OP may be defined as the closing region CL. Therefore, the closing region CL may be formed in a unit pixel adjacent the unit pixel and the peripheral area PA.

By step S140, as illustrated in FIG. 4(b), the stretchable substrate 120 may be exposed through the opening region OP of the stretchable mask pattern SMP, and the stretchable substrate 120 may be exposed through may not be exposed through the closing region CL of the stretchable mask pattern.

The stretchable substrate 120 exposed through the opening region OP may be cured in the subsequent process so that low stretch characteristics may be imparted to the stretchable substrate 120. The closing region CL may block the curing of the stretchable substrate 120 so that the stretchable substrate 120 under the closing region CL may remain as a high stretchable region. Alternatively, a high stretchable region may be formed through the opening region OP, and a low stretchable region may be formed through the closing region CL.

Step S150

In step S150, a hybrid stretchable substrate having both a high stretchable region and a low stretchable region may be formed. As used herein, the hybrid stretchable substrate refers to a substrate in which a high stretchable region and a low stretchable region are partitioned, that is, patterned, and may also be referred to as a stretchable substrate structure.

As illustrated in FIGS. 5a and 5b, a curing process may be performed on the stretchable substrate 120 exposed through the opening region OP of the stretchable mask pattern SMP, thereby forming the low stretchable region RR. For example, the curing process may be performed by using at least one of ultraviolet, plasma, ion beam, neutron beam irradiation, and solution treatment. In this case, the modulus value of the low stretchable region may be controlled according to the type of the curing process.

Meanwhile, the high stretchable region SR may remain as a region having higher stretchability than the low stretchable region RR since the curing process to the stretchable substrate 120 is blocked by the stretchable mask pattern SMP.

Since the opening region OP of the stretchable mask pattern SMP has a shape surrounded by the closing region CL, the low stretchable region RR may have an island shape surrounded by the high stretchable region SR.

According to step S150, since the high stretchable region SR and the low stretchable region RR may be formed in the stretchable substrate 120 through the stretchable mask pattern SMP, the high stretchable region SR and the low stretchable region RR may be finely patterned.

According to one embodiment, the low stretchable region RR may be formed through the opening region OP, and the curing treatment may be performed so that the modulus gradually changes from the center of the low stretchable region RR to the high stretchable region SR. For example, the center of the opening region OP may be irradiated with a strong plasma, and the periphery of the opening region OP may be irradiated with a weak plasma, thereby manufacturing the hybrid stretchable substrate where the modulus gradually changes from the low stretchable region RR to the high stretchable region SR.

According to one embodiment, the modulus difference between the low stretchable region RR and the high stretchable region SR may be 10 times or more.

The stretchable substrate structure may be provided by the above-described steps S110 to S150. That is, the stretchable substrate structure according to one embodiment may include a hybrid stretchable substrate divided into the low stretchable region RR and the high stretchable region SR having a modulus lower than a modulus of the low stretchable region RR, and a stretchable mask pattern SMP having a shape corresponding to one of the low stretchable region RR and the high stretchable region SR.

If the carrier substrate 110 of the stretchable substrate structure is removed, the stretched stretchable substrate 120 may be contracted so that wrinkles may be formed in the thickness direction of the stretchable substrate 120, and the low stretchable region RR may have wrinkles less than wrinkles of the high stretchable region SR. As a result, the stretchable substrate 120 may have stretchability in at least one of a first axis direction and a second axis direction different from the first axis direction.

Step S160

In step S160, the driving element layer DR may be formed. The driving element layer DR may include various driving elements for driving the stretchable display. For example, the driving element layer DR may include a transistor, a capacitor, a wiring, and the like. More specifically, the driving element layer DR may include a combination of a transistor and a capacitor for controlling light emission of an organic layer and a wiring for applying an electric signal.

Among the components of the driving element layer DR, components having relatively high stretchability, for example, a wiring may be formed in the high stretchable region SR, and components having relatively low stretchability, for example, a transistor and a capacitor may be formed in the low stretchable region RR.

As shown in FIG. 6(*a*) and an enlarged view, the driving element layer may include two transistors and one capacitor per a unit pixel. However, this is merely an example for convenience of description, and the driving element layer may include more transistors and more capacitors. In addition, the wiring may include a gate wiring for applying a gate signal to each unit pixel, a data wiring for applying a data signal, and an ELVDD wiring for applying a light emission current. That is, two transistors and one capacitor may be formed in the low stretchable region RR, and the wiring SL may be formed in the high stretchable region SR.

The wiring SL may be formed of a material having a low resistance and stretchability. For example, the wiring SL may be formed of at least one material of aluminum, silver, and copper. In this case, the wiring SL may be formed of a material having the etching selectivity with respect to the stretchable mask pattern SMP by at least 10 or more. Thus, while the stretchable mask pattern SMP is being etched, the wiring SL may remain without being etched. In addition, the wiring SL may have a characteristic that the resistance is maintained within 1.5 times when stretched at most 10%.

As described above, the wiring SL may be deposited on the high stretchable region SR of the stretchable substrate 120. In this case, since the stretchable mask pattern SMP is formed on the high stretchable region SR, the wiring SL may be formed on the stretchable mask pattern SMP. The wiring SL may be formed by a photolithography process or a soluble process.

The transistor constituting the driving element layer may be formed based on various types of channel layers. The channel layer may have a property of providing high mobility. For example, the transistor may include at least one of an oxide transistor using an oxide as a channel layer, a low temperature polysilicon transistor using a low temperature polysilicon as a channel layer, an organic transistor using an organic material as a channel layer, and a single crystal transistor using a single crystal silicon as a channel layer. In the following description, the oxide transistor will be explained as an example for convenience of description.

The transistor may include a metal electrode such as a gate electrode GE, a source electrode SE, and a drain electrode DE.

In addition, the transistor may have various structures. For example, the transistor may have at least one of a top gate structure in which the gate electrode is located at an upper layer of the channel layer, a bottom gate structure in which the gate electrode is located at a lower layer of the channel layer, and a planar structure in which the gate electrode is located in the same layer as the source/drain electrode. In the following description, the bottom gate structure will be explained as an example for convenience of description.

For the convenience of understanding, reference is made to FIG. 6(*b*) which is a sectional view of DRL1 of FIG. 6(*a*). The DRL1 may refer to a transistor region connected to the data line.

Referring to FIG. 6(*b*), the closing region CL of the stretchable mask pattern SMP may be formed in the high stretchable region SR of the stretchable substrate 120. The wiring SL may be formed on the stretchable mask pattern SMP. In this case, the stretchable mask pattern SMP may prevent the high stretchable region SR of the stretchable substrate 120 from being damaged by the wiring SL process. That is, as described above, the stretchable mask pattern SMP not only functions as a mask for partitioning the stretchable substrate 120, but also protects the stretchable substrate 120 during the process.

The low stretchable region RR of the stretchable substrate 120 may be exposed through the opening region OP of the stretchable mask pattern SMP. The above-described transistor may be deposited on the exposed stretchable substrate 120. For example, a gate electrode GE, a first insulating layer I1, an oxide channel layer ACT, a source electrode SE, a drain electrode DE, and a second insulating layer I2 may be sequentially disposed on the stretchable substrate 120. In this case, the first and second insulating layers I1 and I2 may be formed of an organic, inorganic or organic-inorganic composite material, and may be formed of a stretchable material.

In this case, the gate electrode GE, the source electrode SE, and the drain electrode DE may be formed of a material the same as a material for the wiring. Alternatively, the gate electrode GE, the source electrode SE, and the drain electrode DE may be formed of a material different from a material for the wiring.

According to one embodiment, the wiring SL formed in the high stretchable region SR and the metal electrode of the transistor in the low stretchable region RR may be electrically connected to each other. For example, the gate line GL formed in the high stretchable region SR may be electrically connected to the gate electrode GE of the transistor formed in the low stretchable region RR, and the data line DL formed in the high stretchable region SR may be electrically connected to the source electrode GE of the transistor formed in the low stretchable region RR.

Referring again to 6(b) for detailed explanation, the wiring SL formed in the high stretchable region SR, for example, the data line DL needs to be electrically connected to the source electrode of the transistor formed in the low stretchable region RR, for example. However, since the stretchable mask pattern SMP is formed under the wiring SL, a step difference may occur between the wiring SL and the source electrode SE. Therefore, a through hole is formed in the second insulating layer 12 covering the wiring and the transistor, and the interconnector INT is formed via the through hole, thereby solving the problem of the step difference.

Next, reference will be made to FIG. 6(c) which is a sectional view of DRL2 shown in FIG. 6(a). The DRL2 may refer to a gate wiring region.

Referring to FIG. 6(c), the stretchable mask pattern SMP may be formed on the high stretchable region SR, and the gate line GL may be formed on the stretchable mask pattern SMP. The second insulating layer 12 may be formed on the gate line GL. As described above, since the stretchable mask pattern SMP is formed on the high stretchable region SR, damage to the high stretchable region SR may be minimized during the process of forming the gate line GL.

Meanwhile, according to one embodiment, the transistor and the capacitor of the driving element layer may also have stretchability according to the type of materials, and the stretchability may be lower than the stretchability of the wiring.

Step S170

In step S170, at least a part of the stretchable mask pattern may be removed. In other words, a part of the stretchable mask pattern SMP may be removed after the driving element layer forming step S160 and before the light emitting layer forming step S180. In this case, the insulating layer formed on the stretchable mask pattern EMP may also be removed.

Referring to FIGS. 7a, 7b and 7c, in the high stretchable region SR of the stretchable substrate 120, the stretchable mask pattern SMP that is exposed without being covered by the wiring may be removed through the overall etching process. Thus, as shown in FIG. 7(b), the stretchable mask pattern SMP under the wiring SL may remain, however, as shown in FIG. 7(c), the stretchable mask pattern SMP, which is not covered with the wiring SL, may be removed. In another aspect, the stretchable mask pattern SMP in an overlap region with the wiring SL may remain, and the stretchable mask pattern SMP in a non-overlap region with the wiring SL may be removed.

The modulus may become higher in the order of the high stretchable region SR of the stretchable substrate 120, the stretchable mask pattern SMP overlapping the high stretchable region SR, and the wiring SL overlapping the stretchable mask pattern SMP. For example, the modulus of the high stretchable region SR may be 0.01 to 0.1 GPa, the modulus of the stretchable mask pattern SMP may be 1 to 10 GPa, and the modulus of the wiring SL may be 10 to 100 GPa. Accordingly, the remaining stretchable mask pattern SMP may serve as a buffer to compensate for the modulus difference between the high stretchable region SR and the wiring SL, thereby further improving the stretchability.

Step S180

In step S180, the light emitting layer EL may be formed. The light emitting layer EL may include at least one of a hole injection layer HIL, a hole transport layer HTL, an organic layer EL, an electron transport layer ETL, and an electron injection layer EIL. The light emitting layer EL may also have stretchability. In this case, in a state in which the light emitting layer EL is stretched by 10%, the change in the image quality characteristics may be maintained within 25%.

According to one embodiment, a first pixel electrode PXE1 electrically connected to a transistor may be formed before the light emitting layer EL is formed. The first pixel electrode PXE1 may serve as an anode with respect to the light emitting layer EL. In this case, the first pixel electrode PXE1 may be provided for each pixel. In addition, an organic bank may be formed on the first pixel electrode PXE1 to distinguish the pixels. The light emitting layer EL may be formed after the organic bank has been formed.

The light emitting layer EL may be formed in at least a portion of the low stretchable region RR. For example, the light emitting layer EL may be formed only in the low stretchable region RR. Alternatively, as shown in FIGS. 8(a) and 8(b), the light emitting layer EL may also be formed on at least a portion of the high stretchable region SR. For this purpose, the low stretchable region RR and the high stretchable region SR may be provided together in the unit pixel. Since the light emitting layer EL may be formed not only in the low stretchable region RR, but also in the high stretchable region SR, the light emission area may be increased. As the light emission area becomes wider, light luminance characteristics may be improved.

The light emitting layer EL may be formed in various ways. For example, the light emitting layer EL may be formed through a vapor deposition method using a shadow mask. Alternatively, as shown in FIG. 8(b), at least one of the light emitting layers EL may be transferred onto the driving element layer. Since the light emitting layer EL has a size larger than a size of the driving element layer, the light emitting layer EL may be transferred by using process equipment used for an alignment process.

In particular, the process for transferring the light emitting layer may be advantageous when the light emitting layer EL is also formed in the high stretchable region SR in a state where the low stretchable region RR and the high stretchable region SR are present together in the unit pixel. If the light emitting layer EL is transferred when the light emitting layer EL is formed on the high stretchable region SR of the stretchable substrate 120 exposed as the stretchable mask pattern SMP is removed, damage to be applied to the stretched stretchable substrate 120 may be minimized.

After forming the light emitting layer EL, a second pixel electrode PXE2, which comes into electrical contact with the light emitting layer EL, may be formed. The second pixel electrode PXE2 may serve as a cathode with respect to the light emitting layer EL. In this case, unlike the first pixel electrode PXE1 that is provided for each pixel, the second pixel electrode PXE2 may be provided for a plurality of pixels. The second pixel electrode PXE2 may be deposited, for example, by a sputtering process.

After forming the second pixel electrode PXE2, an encapsulation layer Encap may be formed. The encapsulation layer Encap may have a function of blocking moisture and air so that the moisture and air may not penetrate into the light emitting layer EL. To this end, the encapsulation layer Encap may be formed of an organic-inorganic composite film containing an inorganic material and an organic material. For example, the encapsulation layer Encap may include at least one of carbon-based inorganic material such as graphene oxide and carbon nanotubes (CNT) and at least one of acrylic, siloxane, urethane, and ethylene/propylene/diene-based elastomeric polymer resin film.

In the case of the top emission method, the encapsulation layer Encap may be formed of a transparent layer. In contrast, in the case of a reflective emission method, the encapsulation layer Encap may be formed of a material having high reflectivity.

In the description for step S180, it is assumed that the first pixel electrode PXE1 serves as an anode and the second pixel electrode PXE2 servers as a cathode. However, it is also possible that the first pixel electrode PXE1 may serve as the cathode and the second pixel electrode PXE2 may serve as the anode.

In step S190, the carrier substrate 110 may be removed. Before the carrier substrate 110 is removed, a step of forming a groove that provides a stretching path on the stretchable substrate 120 may be performed. For example, when the carrier substrate 110 is formed while the stretchable substrate 120 is stretched in step S120 described above, the groove GR may be formed on the bottom surface of the stretchable substrate 120.

The groove GR may be formed on one surface of the stretchable substrate 120 to provide the stretchable path that allows the stretchable substrate 120 to be contracted in a predetermined shape when the stretchable substrate 120 is contracted in the stretched state.

More specifically, referring to FIGS. 9a, 9b1, 9b2 and 9b3, the groove GR may be formed on the bottom surface A2 of the stretchable substrate 120 in a state in which the driving element layer DR, the light emitting layer EL, and the encapsulation layer Encap are formed on the top surface A1 of the stretchable substrate 120.

For this purpose, a laser for forming a groove pattern may be irradiated onto the lower surface A2 of the stretchable substrate 120. The laser for forming the groove pattern may decompose a fine region on the surface of the stretchable substrate 120, thereby forming the groove GR.

For this purpose, the laser for forming the groove pattern may be selected as light having the property of being absorbed in the stretchable substrate 120 to form the groove GR and passing through the carrier substrate 110. In another aspect, the carrier substrate 110 and the double-sided tape for bonding the carrier substrate 110 and the stretchable substrate 120 may be formed of a material having a high transmittance with respect to the wavelength of the laser for forming the groove pattern. The light intensity and the degree of focusing of the laser may be controlled according to the width and depth of the groove GR.

As shown in FIG. 9 (b1, b2 and b3), the groove GR may have various shapes. Thus, since the groove GR may be formed on the bottom surface A2 of the stretchable substrate 120, the stretch path may be provided when the stretchable substrate 120 is stretched and shrunk.

The groove forming step may be performed between the above-described step S120 and step S130.

After forming the groove, a step of removing the carrier substrate 110 from the stretchable substrate 120 may be performed. The carrier substrate 110 may be removed through various ways. For example, the carrier substrate 110 may be separated from the stretchable substrate 120 by irradiating a line beam laser. In another example, when the carrier substrate 110 and the stretchable substrate 120 are bonded with a double-sided tape that loses the adhesive strength at −30° C. or less, a low temperature environment is provided to separate the carrier substrate 110 from the stretchable substrate.

As the carrier substrate 110 attached to the stretchable substrate 120 in a stretched state is removed, the stretchable substrate 120 may be relaxed, and thus, the stretchable substrate 120 may be formed with wrinkles in the direction of the groove GR.

After the carrier substrate 110 is removed from the stretchable substrate 120, subsequent processes, for example, a process for cutting the stretchable substrate 120 into a unit panel having a desired size and a module process may be performed. Meanwhile, after cutting the stretchable substrate 120 into a unit panel having a desired size, the carrier substrate 110 may be removed from the stretchable substrate 120.

Meanwhile, according to one embodiment, a step of forming a driving circuit element, which applies an electrical signal to the driving element layer, in the peripheral area PA outside the display area may be further performed. For example, when the driving circuit element is prepared in the form of an IC chip, the driving circuit element may be formed on the low stretchable region RR. As another example, when the driving circuit element is prepared in the form of a stretchable film, the driving circuit element may be formed on the high stretchable region SR. The drive circuit element may be formed before or after the carrier substrate is removed.

Accordingly, the stretchable display may be provided by steps S110 to S190 of the method for manufacturing the stretchable display.

The stretchable substrate structure and the manufacturing method thereof, and the stretchable display and the manufacturing method thereof according to the first embodiment of the present invention have been described above. Hereinafter, a method for using the stretchable display manufactured according to one embodiment will be described with reference to FIGS. 11a, 11b and 11c.

FIGS. 11a, 11b and 11c are views for explaining a method for using the stretchable display according to a first embodiment of the present invention.

In the method for using the stretchable display according to one embodiment, the stretchable substrate may be kept in a first use state, in which the stretchable substrate is contracted in a wrinkled state as shown in FIG. 11(a), a second use state, in which the wrinkled state is spread and stretched more than the first use state as shown in FIG. 11(b), and a third use state, in which a material of the stretchable substrate, which is spread from the wrinkled state, is stretched more than the second use state as shown in FIG. 11(c).

As described above with reference to step S120 of FIG. 1, when the stretchable display is manufactured in a state in which the stretchable substrate 120 is formed on the carrier substrate 110 in a stretched state, and the carrier substrate 110 is removed, the stretchable substrate 120 is shrunk so that wrinkles may be formed as shown in FIG. 11(a). In this case, more wrinkles may be formed in the high stretchable region than in the low stretchable region.

In this case, referring to FIG. 11(b), when the user pulls the stretchable display in one direction in the first use state, the wrinkles of the stretchable substrate 120 may be spread so that the second use state may be provided. That is, the low stretchable region RR in the second use state may be longer than the low stretchable region RR in the first use state by a length RRS1, and the high stretchable region SR in the second use state may be longer than the high stretchable region SR in the first use state by a length SRS1. In this case, since more wrinkles are formed in the high stretchable region SR than the low stretchable region RR, the stretch length SRS1 of the high stretchable region may be longer than the stretch length RRS1 of the low stretchable region. In other words, the wiring SL formed in the high stretchable region SR may be stretched more than the driving element formed in the low stretchable region RR.

Furthermore, referring to FIG. 11(c), when the user further pulls the stretchable display in one direction in the second use state, the stretchable substrate 120 may be additionally stretched depending on the characteristics of the material of the stretchable substrate 120. That is, the stretch length is additionally provided by the stretchability of the stretchable substrate 120 in a state where the wrinkles of the stretchable substrate 120 are fully spread. Accordingly, the low stretchable region RR in the third use state may be longer than the low stretchable region RR in the second use state by a length RRS2, and the high stretchable region SR in the third use state may be longer than the high stretchable region SR in the second use state by a length SRS2.

According to the method for using the stretchable display in accordance with one embodiment of the present invention described above with reference to FIGS. 11a, 11b and 11c, the geometric shape of the stretchable substrate may be spread from the contracted state, so that the stretching characteristics may be given, and additionally, the stretching characteristics may be further enhanced due to the stretchability of the material for the stretchable substrate. As a result, the stretchable display according to the one embodiment of the present invention may provide high stretchability.

For example, according to the first embodiment, the stretchable display may have a length elongation of at least 20% in a first axis direction and an area elongation of at least 30% in a second axis direction.

The method for using the stretchable display according to the first embodiment of the present invention has been described above with reference to FIGS. 11a, 11b ad 11c. Hereinafter, the stretchable substrate structure and the stretchable display according to a second embodiment of the present invention will be described with reference to FIGS. 12 to 14.

FIG. 12 is a flowchart illustrating a method for manufacturing a stretchable substrate structure and a stretchable display according to a second embodiment of the present invention, FIGS. 13a and 13b are views for explaining step S270 of FIG. 12 in detail, and FIGS. 14a and 14b are views for explaining step S280 of FIG. 12 in detail.

Referring to FIG. 12, a method for manufacturing a stretchable substrate structure and a stretchable display according to a second embodiment of the present invention may include at least one of a carrier substrate preparation step (S210), a stretchable substrate forming step (S220), a stretchable mask layer forming step (S230), a stretchable mask pattern forming step (S240), a hybrid stretchable substrate forming step (S250), a driving element layer forming step (S260), a light emitting layer forming step (S270), a stretchable mask pattern removal step (S280), and a carrier substrate removal step (S290). For example, the stretchable substrate structure according to the second embodiment of the present invention may be manufactured by steps S210 to S250, and the stretchable display according to the second embodiment of the present invention may be manufactured by steps S210 to S290. Hereinafter, each step will be described.

According to the first embodiment of the present invention, the stretchable mask pattern removal step is performed between the driving element layer forming step and the light emitting layer forming step. However, the second embodiment of the present invention is different from the first embodiment of the present invention in that the stretchable mask pattern removal step is performed after the driving element layer forming step and the light emitting layer forming step.

Hereinafter, the description will be made based on different configurations while omitting the description about the steps redundant with the first embodiment.

Since steps S210 to S260 according to the second embodiment correspond to steps S110 to S160 according to the first embodiment, detailed descriptions thereof will be omitted.

Step S270

In step S270, the light emitting layer forming step may be performed. That is, although the stretchable mask pattern removal step is performed after the driving element layer forming step in the first embodiment, according to the second embodiment, the light emitting layer forming step may be performed after the driving element layer forming step and before the stretchable mask pattern removal step.

The light emitting layer EL is formed on the driving element layer DR, and may be formed in a selective region so that the stretchable mask pattern SMP to be removed in the subsequent process may be continuously exposed. For example, the light emitting layer EL may be selectively formed in the low stretchable region RR between the high stretchable region SR and the low stretchable region RR. As a result, the stretchable mask pattern SMP of the high stretchable region SR may be continuously exposed without being covered with the light emitting layer EL, and thus may be removed in the subsequent process.

In order to selectively form the light emitting layer EL on the low stretchable region RR, each layer constituting the light emitting layer EL may be vapor-deposited through a shadow mask in which the deposition region is opened. As a result, the light emitting layer EL may be formed in the low stretchable region RR, so that the light emitting layers may be spaced apart from each other for each pixel.

The stretchable mask pattern SMP covering the high stretchable region SR may minimize damage that may be applied to the high stretchable region SR during the process for forming the driving element layer and the process for forming the light emitting layer.

Although not described, first and second pixel electrodes PXE1 and PXE2 may be formed for each pixel in lower and upper layers of the light emitting layer EL, respectively. In addition, the light emitting layers formed for each pixel may be protected by encapsulation layers Encap spaced apart from each other for each pixel. That is, the encapsulation layers Encap may also cover the light emitting layer EL by being spaced apart from each other for each pixel to expose the stretchable mask pattern SMP. The encapsulation layer Encap may be selected as a material having a strong characteristic with respect to the etchant in the subsequent process of removing the stretchable mask pattern. For example, the encapsulation layer is formed of at least one material of an inorganic thin film including SiNx, SiO2, SiOxNy, Al2O3 and the like, and an organic thin film including acrylic, siloxane, urethane, epoxy, and imide polymer resins.

In this case, the second pixel electrode PXE2 and the encapsulation layer Encap may be directly dispensed to have the desired patterning through the soluble process in order to minimize the damage applied to the light emitting layer EL when the second pixel electrode PXE2 and the encapsulation layer Encap are patterned.

According to step 5270, as shown in FIG. 13(*a*) and FIG. 13(*b*) showing the section B-B' of FIG. 13(*a*), the stretchable mask pattern SMP and wirings DL and ELVDD may be formed on the high stretchable region SR and an insulating layer may be formed on the wirings. Meanwhile, the light emitting layer EL may be formed on individual pixels including transistors, capacitors, and the like in the low stretchable region RR. Furthermore, encapsulation layers Encap may be formed to cover the light emitting layers EL of individual pixels for each pixel.

Step S280

In step S280, the stretchable mask pattern removal step may be performed.

That is, the stretchable mask pattern SMP covering the high stretchable region SR may be removed. In this case, since the light emitting layer EL and the encapsulation layer Encap described above are formed in the low stretchable region RR so as to expose the stretchable mask pattern SMP covering the high stretchable region SR, the stretchable mask pattern SMP covering the stretchable region SR may be removed. Since the stretchable mask pattern SMP is etched, the stretchable mask pattern SMP formed in a region overlapping the wiring SL may remain, and the stretchable mask pattern SMP formed in a region not overlapping the wiring SL may be removed. In this case, the insulating layer formed on the stretchable mask pattern SMP may also be removed.

After the stretchable mask pattern removal step, a sub-encapsulation layer Sub-Encap may be formed to cover the encapsulation layer Encap over the low stretchable region RR and the high stretchable region SR.

According to step S280, as shown in FIG. 14(*a*) and FIG. 14(*b*) showing the section B-B' of FIG. 14(*a*), the stretchable mask pattern SMP and wirings DL and ELVDD may be formed on the high stretchable region SR and an insulating layer may be formed on the wirings. In this case, the stretchable mask pattern SMP between the wirings DL and ELVDD may be removed. In addition, the sub-encapsulation layer Sub-Encap covering the encapsulation layer Encap may be formed over the low stretchable region RR and the high stretchable region SR.

Since step S290 and subsequent steps thereof correspond to step S190 and subsequent steps thereof according to the first embodiment, a detailed description thereof will be omitted.

Accordingly, the stretchable display may be provided by the method for manufacturing the stretchable display according to the second embodiment of the present invention described with reference to steps S210 to S290. The method for using the stretchable display according to the first embodiment of the present invention described with reference to FIG. 11 may also be applied to the stretchable display according to the second embodiment.

The stretchable display according to embodiments of the present invention described above may include the hybrid stretchable substrate 120 divided into the low stretchable region RR and the high stretchable region SR having a modulus lower than a modulus of the low stretchable region RR, the driving element layer DR including the driving element formed on the low stretchable region SR to control the light emitting layer EL, and the wiring SL formed on the high stretchable region SR and electrically connected to a part of the driving element to apply an electrical signal, and the light emitting layer EL provided on the driving element layer, and electrically connected to the driving element layer to emit light, wherein, between the driving element and the wiring, the wiring may be formed on the stretchable mask pattern SMP while overlapping the stretchable mask pattern SMP.

According to exemplary embodiments, the stretchable substrate 120 is provided on the carrier substrate 110 in a stretched state, and the carrier substrate 110 is removed in the subsequent process, so that the stretchable substrate 120 may be relaxed and wrinkles may be formed on the stretchable substrate 120 in the thickness direction. In this case, when the wrinkles are formed in the stretchable substrate 120, the stretchable substrate 120 may be formed along the wrinkle direction. Accordingly, the stretchable display according to one embodiment may provide a greater amount of stretching due to the geometrical characteristics of the wrinkle structure and the inherent stretchable properties of each material. Thus, high stretchability can be provided.

The stretchable mask pattern SMP according to exemplary embodiments may function as a mask pattern for partitioning the stretchable substrate 120 into the high and low stretchable regions SR and RR. Thus, the high and low stretchable regions SR and RR can be finely patterned. In addition, since the stretchable mask pattern SMP may remain in the subsequent process, damage that may be applied to the high stretchable region SR during the subsequent process may be minimized. In particular, even when the stretchable substrate 120 has a thin thickness in order to have the stretchable property, since the stretchable mask pattern SMP can protect the high stretchable region SR, the stretchable substrate structure and the stretchable display can be manufactured. Furthermore, since portions of the stretchable mask pattern SMP that are positioned under the wiring SL and overlap the wiring SL may remain, it is possible to compensate for the modulus difference between the stretchable substrate 120 and the wiring SL. As a result, durability may be improved even in a stretching environment.

In addition, according to exemplary embodiments, even when the step different occurs during the electrical connection between the wiring SL and the transistor due to the stretchable mask pattern SMP remaining under the wiring SL, a through hole is formed in the insulating layer covering the wiring SL and the transistor and the interconnector is formed via the through hole, so that it is possible to solve the problem of step difference upon the electrical connection.

Further, according to the first embodiment of the present invention, since the stretchable mask pattern is removed between the driving element layer forming step and the light emitting layer forming step, the light emitting layer EL may be formed not only on the low stretchable region RR, but also on the high stretchable region SR, so that the degree of freedom in design can be improved. As a result, the light emission area can be increased, so that the luminance can be improved. In addition, even when the stretchable mask pattern SMP is removed before the light emitting layer forming step, since the light emitting layer EL is transferred, damage to the high stretchable region SR, which is exposed as the stretchable mask pattern SMP is removed, can be minimized. In particular, since it is accepted that the patterning accuracy for the light emitting layer EL is lower than that of the driving element layer, the transfer process can be easily performed.

Further, according to the second embodiment of the present invention, the stretchable mask pattern removal step is performed after the driving element layer forming step and the light emitting layer forming step, damage that may be applied to the high stretchable region SR may be minimized when forming the driving element layer DR and the light emitting layer EL as well as the upper pixel electrode PXE2 and the encapsulation layer Encap.

Although it has not been described in relation to the exemplary embodiments of the present invention, the embodiments of the present invention may be applied to a top emission stretchable display or a bottom emission stretchable display.

Although the invention has been described in detail with reference to exemplary embodiments, the scope of the present invention is not limited to a specific embodiment and should be interpreted by the attached claims. In addition, those skilled in the art should understand that many modifications and variations are possible without departing from the scope of the present invention.

The invention claimed is:

1. A stretchable display comprising:
a hybrid stretchable substrate divided into a low stretchable region and a high stretchable region having a modulus lower than a modulus of the low stretchable region;
a driving element layer including a driving element formed on the low stretchable region to control a light emitting layer, and a wiring formed on the high stretchable region and electrically connected to a part of the driving element to apply an electrical signal; and
the light emitting layer provided on the driving element layer, and electrically connected to the driving element layer to emit light,
wherein, between the driving element and the wiring, the wiring overlaps a stretchable mask pattern having a shape corresponding to one of the low stretchable region and the high stretchable region, and
wherein the hybrid stretchable substrate has wrinkles in a thickness direction of the stretchable substrate, and the low stretchable region has a smaller number of wrinkles than the high stretchable region.

2. The stretchable display of claim 1, wherein the high stretchable region has a lower modulus than the stretchable mask pattern formed on the high stretchable region, and the stretchable mask pattern has a lower modulus than the wiring overlapping the stretchable mask pattern.

3. The stretchable display of claim 1, wherein the stretchable mask pattern includes an amorphous metal alloy or a barrier.

4. The stretchable display of claim 1, wherein a part of the driving element is electrically connected to the wiring, and a height step difference is formed between the part of the driving element and the wiring due to the stretchable mask pattern under the wiring.

5. The stretchable display of claim 1, wherein the modulus of the high stretchable region is lower than or equal to 10% of the modulus of the low stretchable region.

6. The stretchable display of claim 1, wherein a percentage increase in resistance of the wiring does not exceed 50% when the wiring is stretched by 10%.

7. The stretchable display of claim 1, wherein a groove is formed on a surface of the stretchable substrate opposite to a surface where the driving element layer and the light emitting layer are formed, in order to provide a stretching path of the stretchable substrate.

8. The stretchable display of claim 1, wherein the hybrid stretchable substrate is maintained in one of a first state in which the hybrid stretchable substrate is in a wrinkled state, a second state in which the hybrid stretchable substrate is spread and stretched more than the first state to an extent that no wrinkles remain, and a third state in which a material of the hybrid stretchable substrate is spread and stretched more than the second state.

9. A method for manufacturing a stretchable display, the method comprising:
preparing a carrier substrate;
forming a stretchable substrate on the carrier substrate;
forming a stretchable mask layer on the stretchable substrate;
forming a stretchable mask pattern having an opening region and a closing region by patterning the stretchable mask layer;
forming a low stretchable region and a high stretchable region having a modulus lower than a modulus of the low stretchable region on the stretchable substrate through the opening region and the closing region of the stretchable mask pattern;
forming a driving element for controlling a light emitting layer of a pixel on the low stretchable region and forming a wiring for applying an electrical signal to the driving element on the high elastic region, in which the wiring is formed on the stretchable mask pattern forming the closing region; and
forming the light emitting layer electrically connected to the driving element to emit light.

10. The method of claim 9, wherein the forming of the stretchable substrate includes attaching the stretchable substrate to the carrier substrate in a state in which the stretchable substrate is stretched in a first axis direction or a second axis direction.

11. The method of claim 10, wherein, in the forming of the groove, a light source forming the groove is absorbed in the stretchable substrate and passes through the carrier substrate.

12. The method of claim 9, wherein the stretchable mask layer and the stretchable mask pattern include an amorphous metal alloy or a barrier.

13. The method of claim 12, wherein the amorphous metal alloy is an amorphous-state alloy consisting of at least two metals that interfere with each other when forming regular structures.

14. The method of claim 9, further comprising removing the stretchable mask pattern after the forming of the driving element and before the forming of the light emitting layer.

15. The method of claim 9, further comprising removing the stretchable mask pattern after the forming of the driving element layer and the light emitting layer.

16. A stretchable substrate structure comprising:
a hybrid stretchable substrate divided into a low stretchable region and a high stretchable region having a modulus lower than a modulus of the low stretchable region; and a stretchable mask pattern having a shape corresponding to one of the low stretchable region and the high stretchable region.

17. A method of manufacturing a stretchable substrate structure, the method comprising:
    forming a stretchable mask layer on a stretchable substrate;
    forming a stretchable mask pattern having an opening region and a closing region by patterning the stretchable mask layer; and
    forming a hybrid stretchable substrate by forming a low stretchable region and a high stretchable region having a modulus lower than a modulus of the low stretchable region on the stretchable substrate through the opening region and the closing region of the stretchable mask pattern.

* * * * *